(12) United States Patent
Van Der Tempel et al.

(10) Patent No.: US 11,221,401 B2
(45) Date of Patent: Jan. 11, 2022

(54) DETECTOR DEVICE WITH MAJORITY CURRENT AND A CIRCUITRY FOR CONTROLLING THE CURRENT

(71) Applicant: Sony Depthsensing Solutions SA/NV, Brussels (BE)

(72) Inventors: Ward Van Der Tempel, Muizen (BE); Daniel Van Nieuwenhove, Hofstade (BE)

(73) Assignee: Sony Depthsensing Solutions SA/NV, Brussels (BE)

(*) Notice: Subject to any disclaimer, the term of this patent is extended or adjusted under 35 U.S.C. 154(b) by 539 days.

(21) Appl. No.: 16/070,450

(22) PCT Filed: Jan. 12, 2017

(86) PCT No.: PCT/EP2017/050602
§ 371 (c)(1),
(2) Date: Jul. 16, 2018

(87) PCT Pub. No.: WO2017/121820
PCT Pub. Date: Jul. 20, 2017

(65) Prior Publication Data
US 2019/0025414 A1 Jan. 24, 2019

(30) Foreign Application Priority Data
Jan. 15, 2016 (EP) .................................... 16151588

(51) Int. Cl.
*G01S 7/00* (2006.01)
*G01S 7/4863* (2020.01)
(Continued)

(52) U.S. Cl.
CPC ............ *G01S 7/4863* (2013.01); *G01S 17/36* (2013.01); *G01S 17/894* (2020.01);
(Continued)

(58) Field of Classification Search
USPC ......................................................... 356/5.01
See application file for complete search history.

(56) References Cited

U.S. PATENT DOCUMENTS 6,115,114 A * 9/2000 Berg ....................... G01B 11/00
177/25.15
6,466,961 B1 * 10/2002 Miller ....................... G01J 3/26
708/816
(Continued)

FOREIGN PATENT DOCUMENTS

| DE | 10 2011 089629 A1 | 6/2012 |
|---|---|---|
| EP | 2290393 A2 | 3/2011 |
| EP | 2960952 A1 | 12/2015 |

OTHER PUBLICATIONS

International Search Report and Written Opinion for International Application No. PCT/EP2017/050602 dated Apr. 13, 2017.
(Continued)

*Primary Examiner* — James R Hulka
(74) *Attorney, Agent, or Firm* — Wolf, Greenfield & Sacks, P.C.

(57) ABSTRACT

The invention relates to a detector device assisted by majority current, comprising a semiconductor layer of a first conductivity type, a plurality of control regions of the first conductivity type, at least one detection region of a second conductivity type opposite to the first conductivity type and a first source for generating a majority carrier current associated with an electrical field, characterized in that it further comprises control circuitry arranged for controlling the first source and controlling individually at least one of said first majority carrier currents.

20 Claims, 11 Drawing Sheets

(51) Int. Cl.
  *H01L 27/146* (2006.01)
  *G01S 17/894* (2020.01)
  *G01S 17/36* (2006.01)
  *H04N 5/341* (2011.01)
  *G01S 7/493* (2006.01)
  *G05F 1/10* (2006.01)

(52) U.S. Cl.
  CPC .... *H01L 27/1461* (2013.01); *H01L 27/14609* (2013.01); *H04N 5/341* (2013.01); *G01S 7/493* (2013.01); *G05F 1/10* (2013.01); *H01L 27/1464* (2013.01)

(56) References Cited

U.S. PATENT DOCUMENTS

| | | | | |
|---|---|---|---|---|
| 6,906,793 | B2* | 6/2005 | Bamji | G01C 3/00 356/141.1 |
| 6,987,268 | B2* | 1/2006 | Kuijk | H01L 31/101 250/370.01 |
| 7,352,454 | B2* | 4/2008 | Bamji | H01L 27/0805 356/141.1 |
| 7,379,515 | B2* | 5/2008 | Johnson | H03D 7/00 375/347 |
| 8,436,401 | B2* | 5/2013 | Seitz | H01L 27/146 257/222 |
| 8,648,998 | B2* | 2/2014 | Van Nieuwenhove | G01S 17/08 356/5.01 |
| 9,214,492 | B2* | 12/2015 | Van Der Tempel | H01L 27/14612 |
| 2003/0223053 | A1 | 12/2003 | Liu et al. | |
| 2005/0051730 | A1* | 3/2005 | Kuijk | G01S 7/4816 250/370.01 |
| 2006/0128087 | A1* | 6/2006 | Bamji | G01S 17/894 438/199 |
| 2011/0058153 | A1* | 3/2011 | Van Nieuwenhove | G01S 7/4876 356/5.01 |
| 2011/0255071 | A1* | 10/2011 | Van Der Tempel | G01S 7/4913 356/5.01 |
| 2012/0127301 | A1* | 5/2012 | Imai | G01J 3/2823 348/135 |
| 2012/0249819 | A1* | 10/2012 | Imai | H04N 5/23293 348/222.1 |
| 2012/0268618 | A1* | 10/2012 | Imai | H04N 5/23222 348/222.1 |
| 2013/0088612 | A1* | 4/2013 | Imai | H04N 5/238 348/222.1 |
| 2014/0049662 | A1* | 2/2014 | Lin | H04N 5/23222 348/222.1 |
| 2014/0160461 | A1* | 6/2014 | Van Der Tempel | G01S 7/4865 356/5.01 |
| 2014/0253905 | A1* | 9/2014 | Kim | G01S 7/493 356/5.01 |
| 2014/0313376 | A1* | 10/2014 | Van Nieuwenhove | G01S 17/89 348/241 |
| 2015/0001664 | A1 | 1/2015 | Van Der Tempel et al. | |
| 2015/0181099 | A1* | 6/2015 | Van Der Tempel | G01S 17/89 348/135 |
| 2016/0112696 | A1* | 4/2016 | Dielacher | G01S 7/4865 348/46 |
| 2016/0306045 | A1* | 10/2016 | Van Der Tempel | G01S 17/36 |
| 2016/0330391 | A1* | 11/2016 | Bulteel | H04N 5/35572 |
| 2020/0249328 | A1* | 8/2020 | Webster | G01S 7/497 |

OTHER PUBLICATIONS

PCT/EP2017/050602, Apr. 13, 2017, International Search Report and Written Opinion.

* cited by examiner

| 0 | 90 | 0 | 90 | 0 | 90 | 0 | 90 | 0 |
|---|---|---|---|---|---|---|---|---|
| 270 | 180 | 270 | 180 | 270 | 180 | 270 | 180 | 270 |
| 0 | 90 | 0 | 90 | 0 | 90 | 0 | 90 | 0 |
| 270 | 180 | 270 | 180 | 270 | 180 | 270 | 180 | 270 |
| 0 | 90 | 0 | 90 | 0 | 90 | 0 | 90 | 0 |
| 270 | 180 | 270 | 180 | 270 | 180 | 270 | 180 | 270 |
| 0 | 90 | 0 | 90 | 0 | 90 | 0 | 90 | 0 |
| 270 | 180 | 270 | 180 | 270 | 180 | 270 | 180 | 270 |
| 0 | 90 | 0 | 90 | 0 | 90 | 0 | 90 | 0 |

| 0 | NC | 180 | NC | 0 | NC | 180 | NC | 0 |
|---|---|---|---|---|---|---|---|---|
| NC | NC | NC | NC | NC | NC | NC | NC | NC |
| 180 | NC | 0 | NC | 180 | NC | 0 | NC | 180 |
| NC | NC | NC | NC | NC | NC | NC | NC | NC |
| 0 | NC | 180 | NC | 0 | NC | 180 | NC | 0 |
| NC | NC | NC | NC | NC | NC | NC | NC | NC |
| 180 | NC | 0 | NC | 180 | NC | 0 | NC | 180 |
| NC | NC | NC | NC | NC | NC | NC | NC | NC |
| 0 | NC | 180 | NC | 0 | NC | 180 | NC | 0 |

| R | G | R | G | R | G | R | G | R | G |
|---|---|---|---|---|---|---|---|---|---|
| D | B | D | B | D | B | D | B | D | B |
| R | G | R | G | R | G | R | G | R | G |
| D | B | D | B | D | B | D | B | D | B |
| R | G | R | G | R | G | R | G | R | G |
| D | B | D | B | D | B | D | B | D | B |
| R | G | R | G | R | G | R | G | R | G |
| D | B | D | B | D | B | D | B | D | B |
| R | G | R | G | R | G | R | G | R | G |

Figure 11

DETECTOR DEVICE WITH MAJORITY CURRENT AND A CIRCUITRY FOR CONTROLLING THE CURRENT

This Application is a national stage filing under 35 U.S.C. 371 of International Patent Application Serial No. PCT/EP2017/050602, filed Jan. 12, 2017, entitled "A DETECTOR DEVICE WITH MAJORITY CURRENT AND A CIRCUITRY FOR CONTROLLING THE CURRENT". Foreign priority benefits are claimed under 35 U.S.C. § 119(a)-(d) or 35 U.S.C. § 365(b) of European application number 16151588.7, filed Jan. 15, 2016. The entire contents of these applications are incorporated herein by reference in their entirety.

TECHNICAL FIELD OF THE INVENTION

The invention relates to a detector device assisted by majority current for detecting an electromagnetic radiation impinging on a semiconductor layer, wherein a majority carrier current is generated between two control regions and wherein photo-generated minority carriers are directed towards a detection region under the influence of an electrical field generated between the control regions.

The invention can be used in imagers, particularly Time-Of-Flight imagers.

BACKGROUND OF THE INVENTION

Nowadays, more and more detection devices implement Time-Of-Flight (TOF) technologies for obtaining depth information. A basic Time-Of-Flight (TOF) camera system 3 is illustrated in FIG. 1. TOF camera systems capture 3D images of a scene 15 by analysing the time of flight of light from a light source 18 to an object. TOF camera system 3 includes a camera with a dedicated illumination unit 18 and data processing means 4.

The operational principle of a TOF camera system is to actively illuminate the scene 15 with a modulated light 16 at a predetermined wavelength using the dedicated illumination unit, for instance with some light pulses of at least one predetermined frequency. The modulated light is reflected back from objects within the scene. A lens 2 collects the reflected light 17 and forms an image of the objects onto an imaging sensor 1 of the camera. Depending on the distance of objects from the camera, a delay is experienced between the emission of the modulated light, e.g. the so called light pulses, and the reception at the camera of those light pulses. Distance between reflecting objects and the camera may be determined as function of the time delay observed and the speed of light constant value. In one another more complex and reliable embodiment, a plurality of phase differences in between the emitted reference light pulses and the captured light pulses may be determined by correlation measurement and used for estimating depth information.

The determination of the phase differences can be carried out notably by Current-Assisted Photonic Demodulators (CAPDs). The principle of CAPDs is explained in EP1513202 and illustrated by FIGS. 2A-C. It is based on demodulation nodes, the so-called "taps". The CAPD represented on FIGS. 2A-C comprises two taps. Each tap consists of a control region 61, 62 and a detection region 63, 64. By controlling a potential applied between the control regions 61 and 62, it is possible to control the detectivity of the associated tap. When a photon is incident on the photosentitive area of a pixel, an electron-hole $e^-/h^+$ pair may be generated at a certain position. The electron-hole pair will be separated by an electrical field that is present and that is associated with the flowing majority current. This electrical field will cause the photogenerated minority carriers 66, 69 to drift in the opposite direction to the flowing majority current, i.e. towards the detection regions 63, 64, respectively.

When a pixel comprises several taps and when a positive potential is applied to a tap with respect to the other taps, this tap is activated and will be receiving the majority of the photogenerated minority carriers in the pixel, as illustrated by FIGS. 2B and C. By applying appropriate driving signals to the control regions, correlation measurements can be performed and the depth perception can be obtained.

A challenge in Time-of-Flight sensors based on CAPD pixel devices is to optimize the TOF sensor and system to the needs of the encountered use cases and situations. It is preferable that these optimizations can be done without hardware changes and in a dynamic way. One of these optimizations is to adjust the spatial resolution of the sensor to the needs of the situation. For example when strong ambient light is present in the situation, this light adds significant amounts of noise to the TOF measurement and the TOF system could choose to lower the spatial resolution by means of TOF pixel binning (adding together of the individual pixel informations) to get a more accurate depth estimate.

The disclosed invention presents a way to achieve this resolution control in the charge domain. This means that read noise can be reduced with respect to binning techniques in the digital domain.

SUMMARY OF THE INVENTION

The present invention relates to a sensor consisting of collaborative pixels based on CAPD principle according to claim 1.

In prior art the optical area of each single pixel in a sensor is allocated to the N taps (or detection regions) of the pixel. Control regions (p-implants in the case of CAPD devices, polysilicon gates in the case of PMD devices, etc) allow the taps to collect intermittently the minority carriers generated in the optical area during the active window of each tap. In case the pixel is built with only one tap, a dump or drain node is foreseen in the pixel to dump the minority carriers generated in the time-window outside of the active window of the tap. This is the prior art conventional TOF pixel architecture in which each pixel is an in theory closed system if non-idealities such as blooming and crosstalk are not considered.

The present invention introduces the concept of collaborative pixels, where each pixel is operating together with surrounding pixels. The principle applies mainly to TOF pixels consisting of a single tap but can be expanded to more taps per pixel.

Each pixel now may share at least one part or portion of its optical area, said optical area being also termed volume, with surrounding pixels and likewise the surrounding pixels may share at least one part or portion of their optical area with at least the optical area of at least another pixel. The control region of the pixel controls the activity window of the detection region (or tap). In the ON state the detection region gathers minority carriers generated in its optical area but also gathers from surrounding shared optical areas of pixels in inactive or OFF state. In the OFF state the optical area becomes available for the gathering of minority carriers by the nearest active neighbours.

By careful control of the individual tap control signals the pattern created by the collaborative pixels in the sensor can be adjusted. Also, using the right control signal pixel could become completely inactive (for example with Not Connected control signal) and bypassed in the collaboration. This allows adjustment of the actual resolution of the sensor as the complete image sensor area is now distributed over fewer operational taps. Such a careful control not only enables creating overlapping virtual pixel zones (200) by sharing one or more portions of the associated volume of a pixel with one or more neighbouring pixels, but it further enables the change of the optical The pixel detector device of the present invention can comprise control circuitry arranged for controlling the first source and controlling individually at least one of said first majority carrier currents. Thanks to this individual control, one larger pixel is artificially created and the operational pixel structure is enlarged to a bigger virtual pixel zone, similar to what would happen if the data of the pixels were binned together during post-processing. This individual control offers the advantage of requiring only one read-out for the artificially bigger pixel. Thanks to the individual control, both issues of reading time and high readout noise are overcome.

Preferably, the detector device further comprises a plurality of adjacent taps, each tap comprising at least one detection region and at least one control region and the control circuitry is further arranged to put two adjacent taps in a non-sensing state, by reducing or eliminating an associated first majority carrier current, to allow re-direction of the generated minority carriers to the closest sensing detection region. Thanks to this feature, the binning is performed in real-time and "on chip".

A selector is preferably implemented in the detector device of the present invention for selecting a predetermined voltage $V_{mix}$ to be applied to the control regions by the first source.

Selectors can also be implemented on a column/level to assign controls to groups of pixels. This way dynamic definition of the pattern can be achieved through control of the column-level selectors.

The first source may also be adapted for supplying a DC voltage, resulting in only vertical fields.

BRIEF DESCRIPTION OF THE DRAWINGS

The present invention shall be better understood in light of the following description and the accompanying drawings.

FIG. 5 shows a possible family of signals to be used by the first source of FIG. 3.

FIG. 6 to FIG. 9 show different phase configurations of pixels in the detector device according to the present invention;

FIG. 11 shows another example of the detector device comprising optical filters according to the present invention.

DESCRIPTION OF THE INVENTION

The present invention will be disclosed in reference to a detection device 300 also termed SENSOR. The detection device 300 contains PIXELS 125 also referred as PIXEL. Typically the Pixel 125 contains at least 1 TAP, consisting of at least 1 detection region and at least 1 control region also referred as TAP.

The invention will also be explained with reference to p-type epitaxial layer and substrate, but the present invention includes within its scope a complementary device whereby p and n regions become n and p regions respectively. A skilled person can make such modification without departing from the spirit of the invention.

It should also be understood that the terms n, p, $n^+$, $p^+$ and $p^-$, n-well, p-well, deep n-well and deep p-well are well known by the one skilled in the art. The terms n, p, $n^+$, $p^+$ and $p^-$ refer to ranges of doping levels in semiconductor materials well known by the one skilled in the art.

The terms n and p refer to n-doped and p-doped regions, usually arsenic and boron doped regions, respectively. $n^+$, $p^+$ refer to highly doped shallow contact regions for NWELL and PWELL respectively. $p^-$ refers to lowly doped p type region such as a PWELL.

The present disclosure relates to embodiments regarding both Front Side Illumination (FSI) and Back Side Illumination (BSI) devices. Front Side Illumination and Back Side Illumination devices are defined by referring to the location of the circuitry on the chip compared to the impinging light. By FSI, it is meant a device where the light impinges on the same side than the circuitry. With FSI, light falls on the front side of the circuitry, and passes through the readout circuitry and interconnects before it is collected in the photodetector. On the contrary, by BSI, it is meant a device where the light impinges on the other side, where the circuitry is not located, i.e. in the backside. The main idea behind the fact of using BSI structure is that no light is lost while passing through the circuitry.

Figure 1:
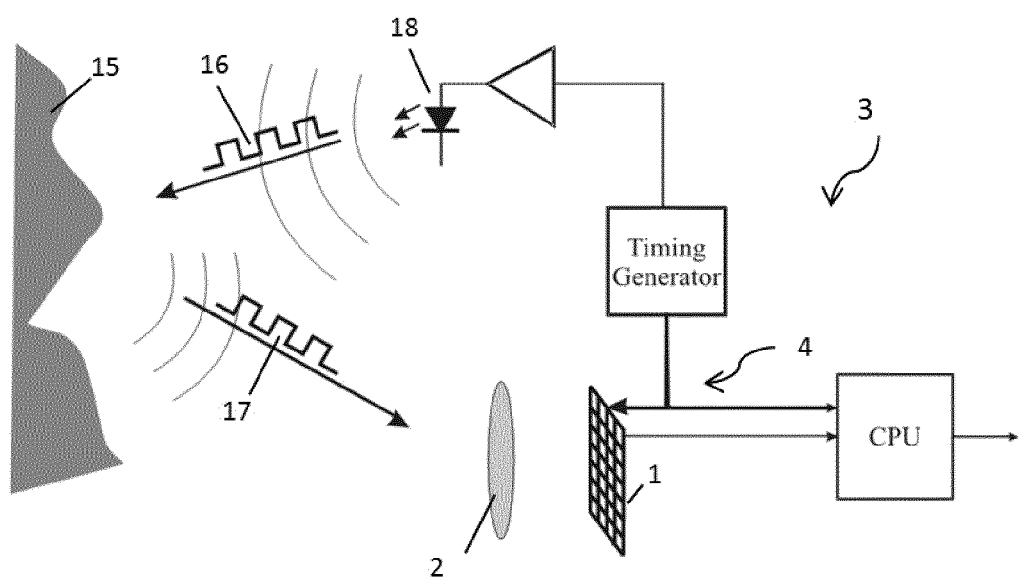
FIG. 1 illustrates the basic operational principle of a TOF system.
Figure 2:
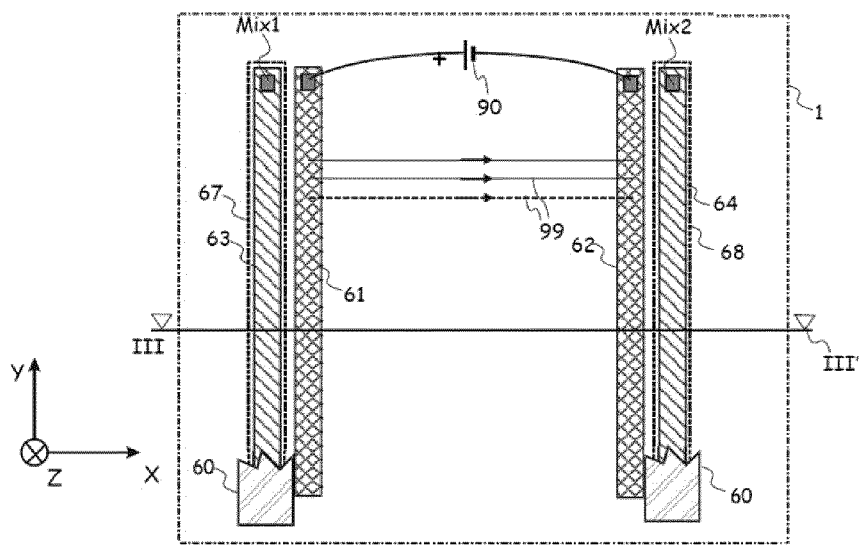
FIG. 2A shows a top view of a device according to prior art.
FIG. 2B and FIG. 2C show a cross-section of the device of FIG. 2A with two different current conditions.
Figure 2:
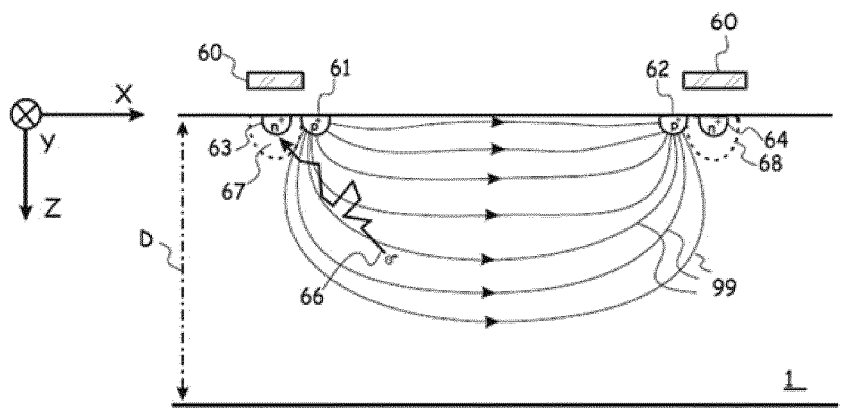
Figure 2:
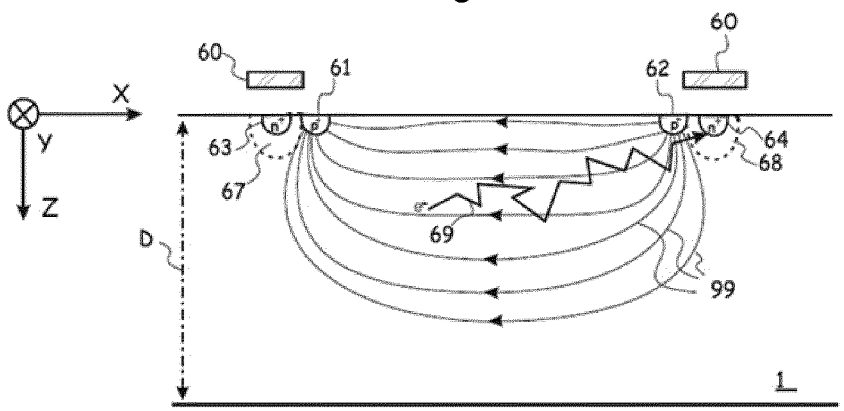
Figure 3:
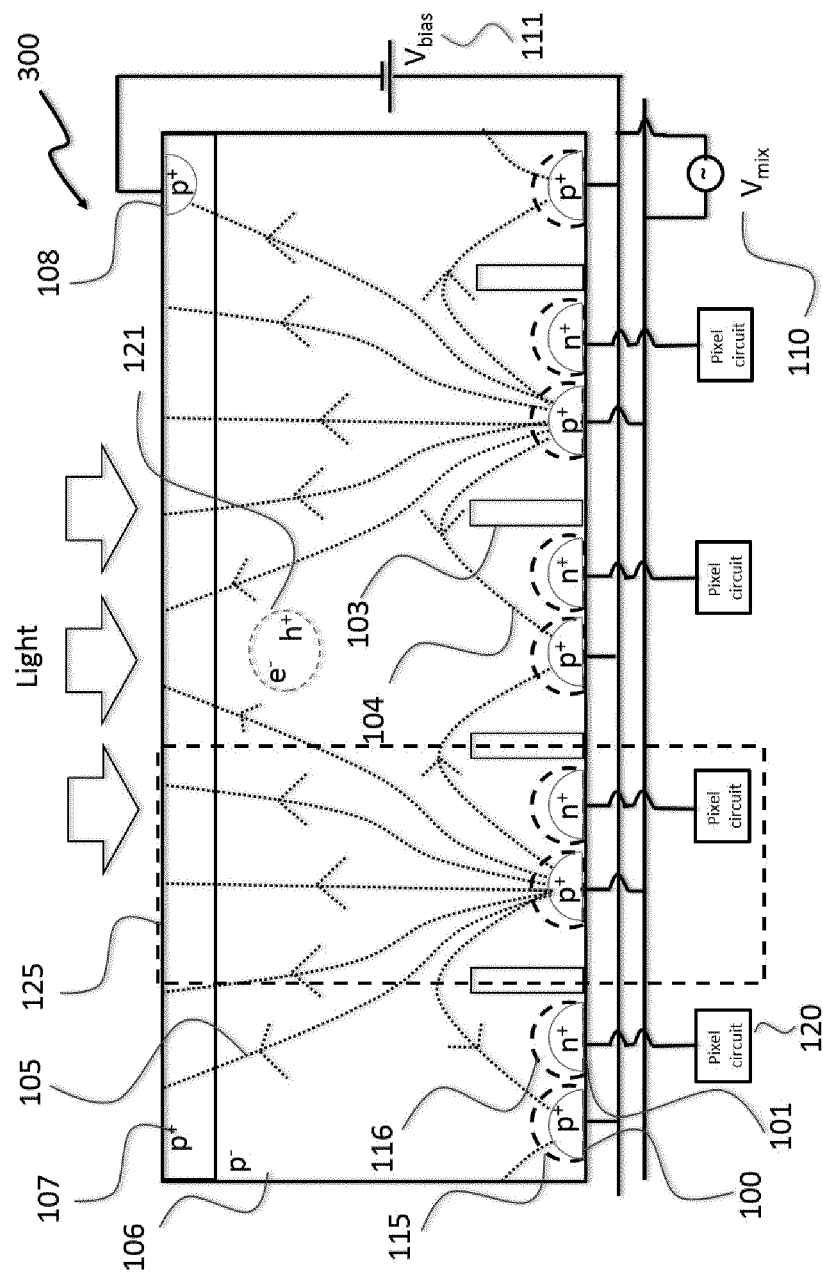
FIG. 3 shows an example of the detector device according to the present invention.

FIG. 3 shows an example of a detector device according to the present invention.

The detector device 300 of the present disclosure is assisted by majority current for detecting an electromagnetic radiation. The radiation can be any type of radiation, but preferably light in the visible range or an infrared radiation.

The detector device 300 comprises a semiconductor layer 106 on which an electromagnetic radiation can impinge for generating therein pairs of majority and minority carriers 121. The semiconductor layer 106 is doped with a dopant of a first conductivity type, a p dopant in the example of FIG. 3. This semiconductor layer 106 is preferably p-doped.

The detector device 300 further comprises at least two control regions 100, 115 formed in the semiconductor layer 106. The control regions 100, 115 are p doped in the exemplary embodiment. The control regions may comprise a p+ diffusion region 100 and a p-well 115, so that the p+ diffusion region 100 and the p-well 115 form together the control region.

A first source $V_{mix}$ is provided for generating at least one first majority carrier current 104 in the semiconductor layer 106 between pairs of control regions, the first majority carrier currents 104 being associated with a respective first electrical field. This source $V_{mix}$ may be a AC voltage source or a DC voltage source, as it will be explained later. This source $V_{mix}$ is defined in this document as a voltage source, but might as well be implemented as a current source. All voltage sources discussed in the rest of this document (110, 111), could as well be replaced with current sources. Although voltage sources are preferred, current sources have advantages with respect to their output impedance and hence can provide benefits as well.

The detector device further comprises at least one detection regions 101, 116 formed in the semiconductor layer 106 and being doped with a dopant of a second conductivity type opposite to the first conductivity type, i.e. a n dopant here, for forming a junction and collecting generated minority carriers. In FIG. 3, two detection regions 101, 116 are shown, but the invention is not limited thereto and could be implemented with only one detection region for instance. The minority carriers are directed towards the detection region 101, 116 under the influence of the first electrical field respectively associated with the at least one first majority carrier current 104. The detection regions may comprise a n+ diffusion region 101 and a n-well 116 so that the n+ diffusion region 101 and the n-well 116 form together the detection region.

The detection regions and the control regions are associated in taps, one tap comprising at least one detection region and at least one control region. In the present disclosure we will assume that each pixel 125 of the detector device 300 comprises one tap. In practice, the pixel 125 may comprise more than one tap (e.g. 2-tap, 4-tap, . . . ). One pixel comprises all the elements encircled by the dashed line 125 in FIG. 3.

Each pixel 125 can further have the property that one or several portions of its associated volume are shared with one or several neighbouring pixels and that likewise at least one or several portions of the associated volume of one or several neighbouring pixels are also shared to said pixel. The result is that virtual pixels with a virtual pixel zone are formed, whereby the boundary of the virtual pixel is the edge of the total volume which can be associated with each pixel. Because of the existence of volume sharing between pixels, the volume of the virtual pixel is typically bigger than the volume of pixel 125. This volume sharing property is dependent on the applied control signals and can change over time as different control signals are applied during operation of the device.

In this invention, pixels may work together to achieve modulated detectivity. Majority carrier currents flowing between ON and OFF state pixel control regions form electric fields between these pixels, which depending on the polarity of the current and field either push minority carriers away from detection region of and out of the optical area of the OFF pixel; or, in the ON state attract minority carriers into the optical area and towards the detection region of the ON state pixel. A third state NC (Not Connected) whereby the pixel does not influence the field in the substrate can be thought of, for example by forcing the control region majority carrier current to 0, rendering the pixel transparent whereby the optical area of this pixel is used by and shared to any passing majority carrier current created by other interacting ON/OFF pixel groups. Many more states can be thought of to make variations of sensitivity using the majority carrier current flexibility, the rest of this document will limit to explaining the ON/OFF/NC state.

Through the control regions, the pixels can be in ON/OFF/NC state, but also in an intermediate state element of a continuous set of states. In case of the pixel consists of more than 1 tap, each tap will have a state.

The control regions of the pixels of detector device 300 can be organised in groups of at least 1 pixel, forming a pattern, where the control regions of pixels in the same group have the same control state.

Each group of pixels, consisting of at least one pixel, may further comprise control circuitry for applying the desired state to the control regions of the group. The state applied is typically a dynamic signal.

The detector device 300 may further comprise isolation means 103, formed in the semiconductor layer 106 for increasing the path resistance by deflecting the first majority carrier current 104 generated by the first source $V_{mix}$ between pixels with ON and OFF control regions and, hence reducing the amplitude of said first majority carrier current 104 and, therefore, reducing the power consumption of the detector device 300. These isolation means may comprise at least one Trench Isolation region 103, which can be disposed at various positions between the pixels.

The isolation trench regions 103 or isolation barriers can be implemented in many different ways, e.g. by etching techniques, such as deep or shallow trench etching, or by implementing isolation barriers applied before growing epitaxial layers. The most important is that they increase the resistance of the majority carrier current path between ON/OFF pixel groups.

Figure 4:
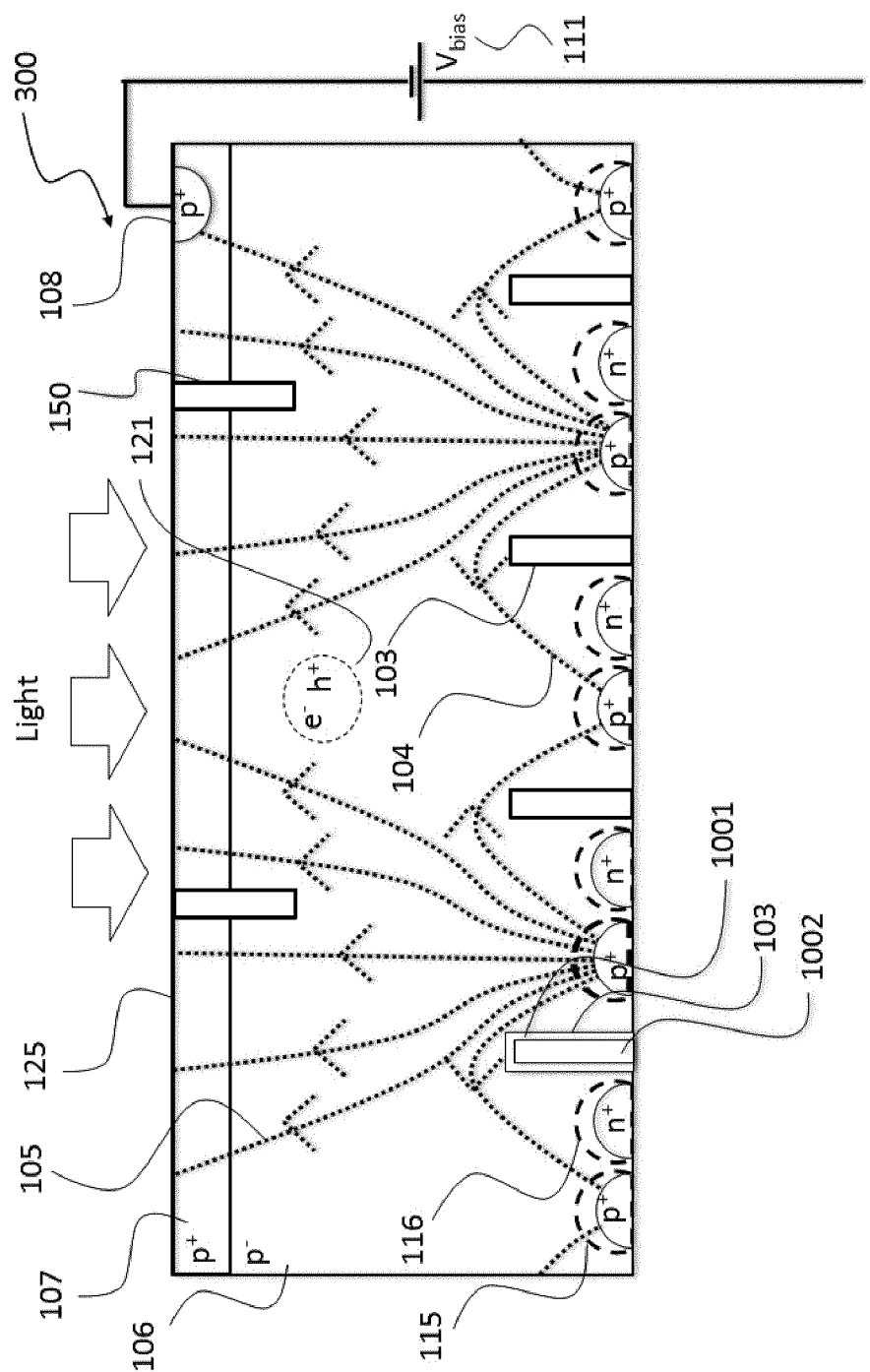
FIG. 4 shows a further example of the detector device according to the present invention.

This barrier 103 can be treated in a number of ways to avoid leakage along the barrier in the form of surface states and leaky etched surface. To avoid this, the isolation trench 103, can be for example a deep etch, with an isolator 1001 between the silicon surface of the etch. This can be for example, but not limited to, a silicium-oxide, and for example (but not limited to) a polysilicon plug 1002 in the etched trench, which allows to bias the potential of the polysilicon plug to avoid channel formation on the etch surface, as illustrated in FIG. 4. The isolation means 103 are preferably biased with a potential. The trench isolation region or the deep trench isolation region can be filled with an electrical conductive material or semiconductor such that a voltage can be applied.

The detector device 300 of the present invention may comprise at least one further trench isolation region 150 formed at the backside of the semiconductor layer 106, as illustrated in FIG. 4. The function of these further trench isolation regions 150 is to prevent deeper penetrating light beams from entering adjacent pixel regions by tuning the refractive index of the trench fill material with respect to the refractive index of silicon.

The trench isolation regions 103, 150, formed in the front side of the semiconductor layer or both in the front side and in the backside of the semiconductor layer, may comprise Deep Trench Isolation regions and/or Ultra Deep Trench Isolation regions.

Preferably, the thickness of the semiconductor layer is adapted for Back Side Illumination (BSI) and the detection region 101, 116, the control regions 100, 115 (and the isolation means 103, if present) are formed in the front side of the semiconductor layer 106.

More preferably, a second source $V_{bias}$ 111 is implemented within the detector device 300 for generating a second majority carrier current 105 in the semiconductor layer 106 between at least one control region 100, 115 formed in the front side of the semiconductor layer 106 and the backside of semiconductor layer 106. Said second majority carrier current 105 is associated with a respective second electrical field. The generated minority carriers are directed towards the front side of the semiconductor layer 106 under the influence of the second electrical field respectively associated with the at least one second majority carrier current 105.

The backside of the detector device 300 may comprise a passivation layer 107 formed on the backside of the semiconductor layer 106 and being doped with a dopant of the first conductivity type, e.g. a p+ doped layer 107. This helps spread the field applied using source 111.

Another option is to have a lowly doped epitaxial on top of a highly doped substrate. This substrate can then as well serve to spread the voltage applied using source 111 and could be thinned to reduce the thickness.

The detector device 300 may further comprise at least one contact region 108 formed on the backside of the semiconductor layer 106 and being doped with a dopant of the first conductivity type. The second majority carrier current 105 is generated by the second source 111 in the semiconductor layer 106 between the at least one control region 100, 115 formed in the front side of the semiconductor layer 106 and said contact region 108.

Another way to contact the backside could be a deep-pwell structure at the front side, deep enough to connect to the passivation layer. Hence this pwell can be biased from the frontside and allows to apply and control the strength of the second electrical field. Thus, the passivation layer 107 may be contacted using a deep well formed in the front side of the semiconductor layer 106.

It should be understood that, even without implementing such elements 107, 108 and 111, the operation of the detector device 300 in BSI configuration is possible, since a built-in electrical field is typically present vertically within the device 300. These elements are optionally implemented for enhancing the second electrical field.

The voltage sources $V_{mix}$ 110, and $V_{bias}$ 111, invoke guiding fields in the semiconductor layer. $V_{mix}$ is applied over adjacent pixels as shown, while $V_{bias}$ induces a voltage delta between the front side and the backside of the semiconductor layer 106. These voltage sources 110 and 111 induce first majority carrier currents 104 between the pixels, and second majority carrier currents 105 from front to back, respectively. Opposite with the current sense, an electric field is induced. When the light hits the semiconductor layer 106 from the backside, electron hole pairs 121 are generated. The hole flow with the induced majority current, towards the backside, while the electron is guided towards the front side. When nearing the front side, the electron will be driven to the pixel with the highest biased p+ diffusion 100, where it will enter the adjacent n+ diffusion 101 and enter the pixel readout circuit 120 for further processing. This circuit 120 can be a 3T, 4T or other pixel read-out circuit. The processing circuitry 120 may be arranged for sampling a value related to the minority carrier charge collected by the detection regions and for processing said value and outputting Time-Of-Flight data.

The invention enables a smart organisation of pixel structures and enables improvement of binning methods in TOF imagers. Binning is the adding together of the individual pixel informations, typically to improve signal-to-noise ratio of the binned information. The information can be for example represented in electrons, current, voltage or digital numbers.

Figures 5, 6:
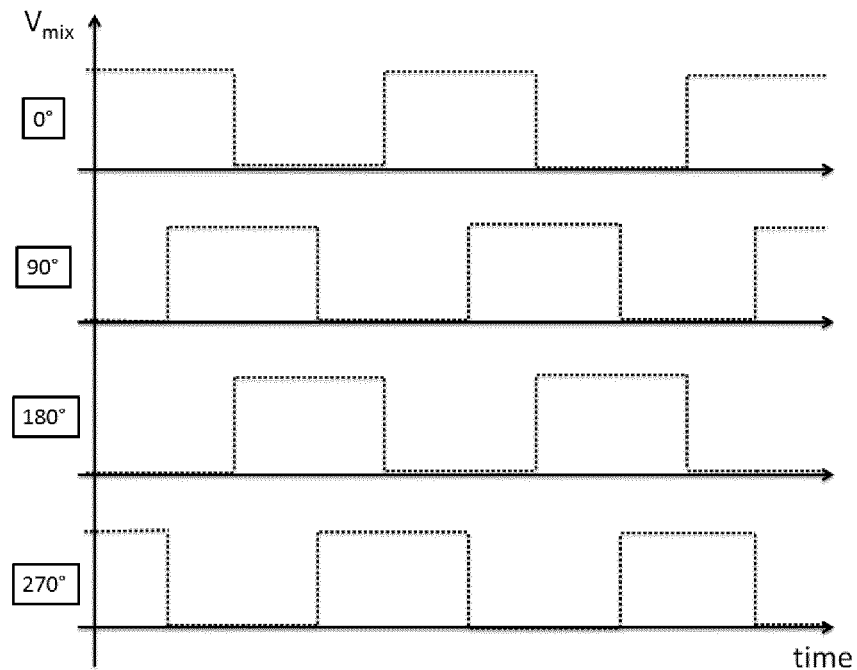

FIG. 5 shows a possible family of signals to be used by the source $V_{mix}$ 110 of FIG. 3. In this case, the signal is oscillating the state of the control region between ON and OFF state with a certain frequency and phase. Alternatively the control signal could switch between other pre-defined states, such as NC (not shown). Therefore the associated detector volume is changing over time and is dependent on the control signals of the pixel and its surrounding pixels. Although any range of time/phase delays (in seconds or 0-360)° and signal shapes (sinusoidal, PRBS, sawtooth, square, . . . ) can be used, we will use in this description square waves and combinations of 0°/90°/180°/270° phase delays, where the 0° signal is typical used for the modulated light signal.

FIG. 6 shows a schematic on how to organize the pixel in a detector device, e.g. a TOF imager, where a checkerboard pattern is used, applying 0° and 180° out of phase signals. The pixels marked with a 0, are connected to one terminal of the source $V_{mix}$ 120 shown in FIG. 3, while pixels marked with 180 are connected to the other side. In a typical operation two measurements are taken: one with 0 and 180 degree phase delay, and subsequently one with 90 and 270 degree phase shifted measurement.

Note that for this configuration specifically every control region is at all times surrounded by control regions with another control signal. E.g. as shown on the drawing, every control region biased with 0 degree phase shift is surrounded with 4 pixels with a 180 degree phase shift, hence in this embodiment every control region is surrounded with control regions with a control signal in counter-phase. In other words when a pixel is in the ON state, its surrounding pixels are all in the OFF state, and vice-versa. A lot of other configurations can be thought of, e.g. where all the columns or rows have the same control signal (e.g. 0 degree phase shift) and every other row or column is changing phase shift (e.g. 180 degree phase shift) or other configurations as shown in next drawings (e.g. FIG. 7, as will be described below).

For one pixel, the virtual pixel zone 200 is shown, which extends beyond an individual cell. This virtual pixel zone is similar for all pixels in the array and due to the field lines extending outside the pixel boundaries when nearing the sensitive surface, as shown in FIG. 3. Hence the virtual pixel zone of a pixel is overlapping with the virtual pixel zone of one or several neighbouring pixels.

Because all the acquired information overlaps, one may want to post-process to calculate the per pixel isolated 0, 90, 180, 270 degree phase shifted data. This may typically be done using the surrounding pixel data in time and space. For example doing simple interpolation, using median or average values or by choosing data combinations based on extra information, such as gradients/edges or detected movement.

In traditional color sensors similar concepts exists to achieve per pixel color data, called de-mozaicing, where it is typically used to achieve per pixel red, green, blue data, as known by a person skilled in the art.

Organising a TOF imager in such a way enables to use all the impinging light, as it is at all times captured in a detector node, while not requiring a high number of taps in each pixel, which would require a bigger pixel structure. This configurability of the virtual pixel zone is obtained reorganising the electric fields in the CAPD as discussed above.

In summary it may be preferred to design an image sensor comprising a plurality of detector devices, the image sensor being arranged for implementing this extra demosaicing step to calculate individual pixel data from the overlapping pixel data obtained.

Another scheme is shown in FIG. 7, where the data related to 0, 90, 180, 270 degree are obtained in parallel by driving the different phase shifted $V_{mix}$ signals to different pixels in the imager.

In order to increase Signal-to-Noise ratio, it is important to have flexible mechanisms to bin pixel data together, creating one larger pixel. The detector device 300 of the present disclosure resolves this specific issue, as follows.

In FIG. 8, a scheme is shown whereby several pixels are put in a Not Connected-state (=NC), thereby interacting as little as possible with the majority carrier current and electric field associated with the remaining operational pixels. As a result, minority carriers created by impinging light or other generation phenomena are transported by the present electric field. The optical area of the NC pixels thus becomes part of the operational ON/OFF pixel groups which electric field passes through the NC pixel. Hence, the operational pixel structure is enlarged to virtual pixel zone 202, similar to what would happen if pixels where to be binned together on the charge domain, so requiring fewer pixel read-outs.

Figure 9:
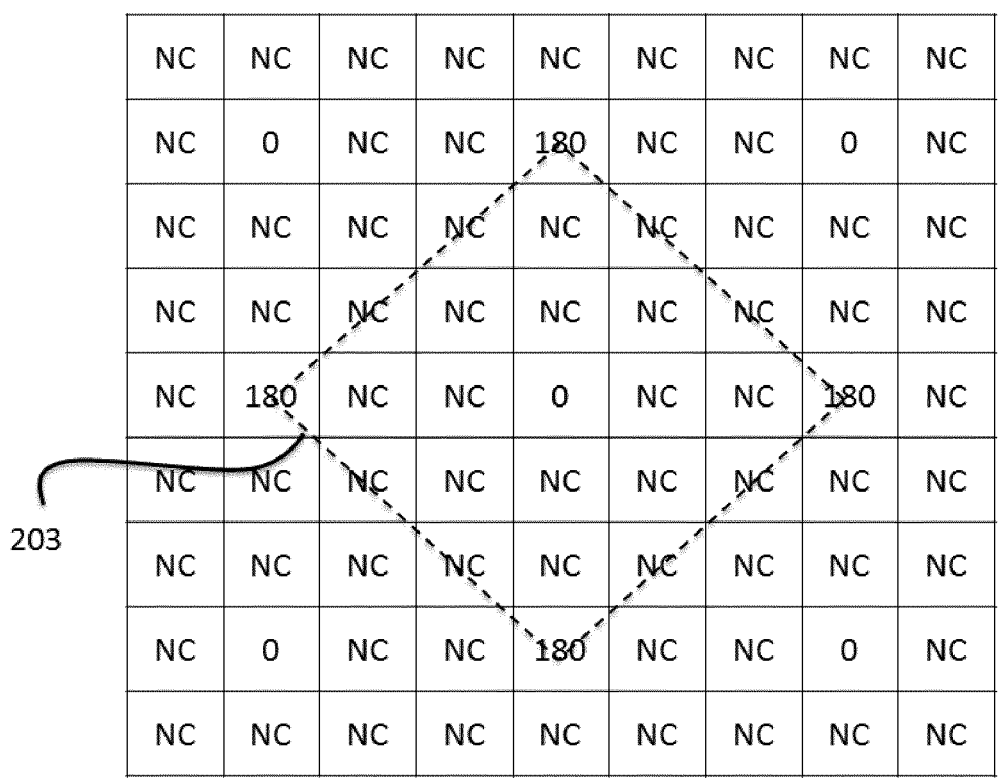

To illustrate further the concept, in FIG. 9, an even bigger pixel with a virtual pixel zone 203 is obtained by putting even more pixels in the NC state. Concretely any shape or structure of NC versus connected pixels can be made, where the light entering above the NC pixel structure is equally distributed over the surrounding connected pixels.

These binning states can be decided at run-time by configuring pixels in the NC state, while others are kept operational. This allows for a very flexible binning approach, configurable at run-time.

The FIGS. 8 and 9 show 0 and 180 measurement configurations. Obviously, 90 and 270 degree measurements could be obtained again in subsequent measurements, or by configuring the pixel scheme to obtain this in parallel as for example illustrated in FIG. 7.

The NC-state could be not connected, but could also be minimally connected with a weaker voltage or different voltage. The idea of this state is to put pixels in a non-sensing state and allow re-direction of the generated minority carriers in these pixels, here electrons, to the closest sensing detection region.

The non-sensing state of said pixels may be obtained by disconnecting their control regions so that the associated first majority carrier current (104) is eliminated.

Alternatively, the non-sensing state of said pixels may be obtained by connecting their control regions to a predetermined voltage so that the associated first majority carrier current (104) is reduced, the predetermined voltage being lower than a voltage used in a sensing state. In other word, instead of putting the pixel in a NC-state where it would not participate, the pixel may be put in a state where it would still participate, but receive less signal, thus creating a pixel with reduced sensitivity. This can be advantageous to create more dynamic range or enable ambient light robustness. Further, an additional control of the individual pixels or pixel groups may be needed and/or beneficiary in the case of enlarging the pixel virtual pixel zone by disabling the in-between pixels. For example an additional control of the reset line can be foreseen where the detectors of unused pixels are left saturated so that these no longer can sink minority carriers. Essentially this then serves as an alternative way to put a pixel in the NC state. This control can be implemented either per pixel, or groups of pixels, or on column-level or row-level, per groups of rows or columns or on a chip-level.

The detector device 300 of the present disclosure may comprise control circuitry arranged for controlling the first source (110) and controlling individually at least one of said first majority carrier currents (104).

Furthermore, the detector device 300 of the present disclosure may comprise a plurality of adjacent pixels, each pixel comprising at least one detection region and at least one control region. The control circuitry may be further arranged to put groups of at least 1 pixel in an ON, OFF, NC or other sensing or non-sensing state, by reducing, eliminating or reversing an associated first majority carrier current (104) to allow re-direction of the generated minority carriers to the closest sensing detection region.

The control circuitry may also be arranged for cancelling temporally at least one of said deflected first majority carrier currents 104 by driving the source $V_{mix}$ 110 appropriately.

The control circuitry may also be arranged for reducing or eliminating the associated taps from participating in detecting the generated minority carriers, as explained.

Figure 10:
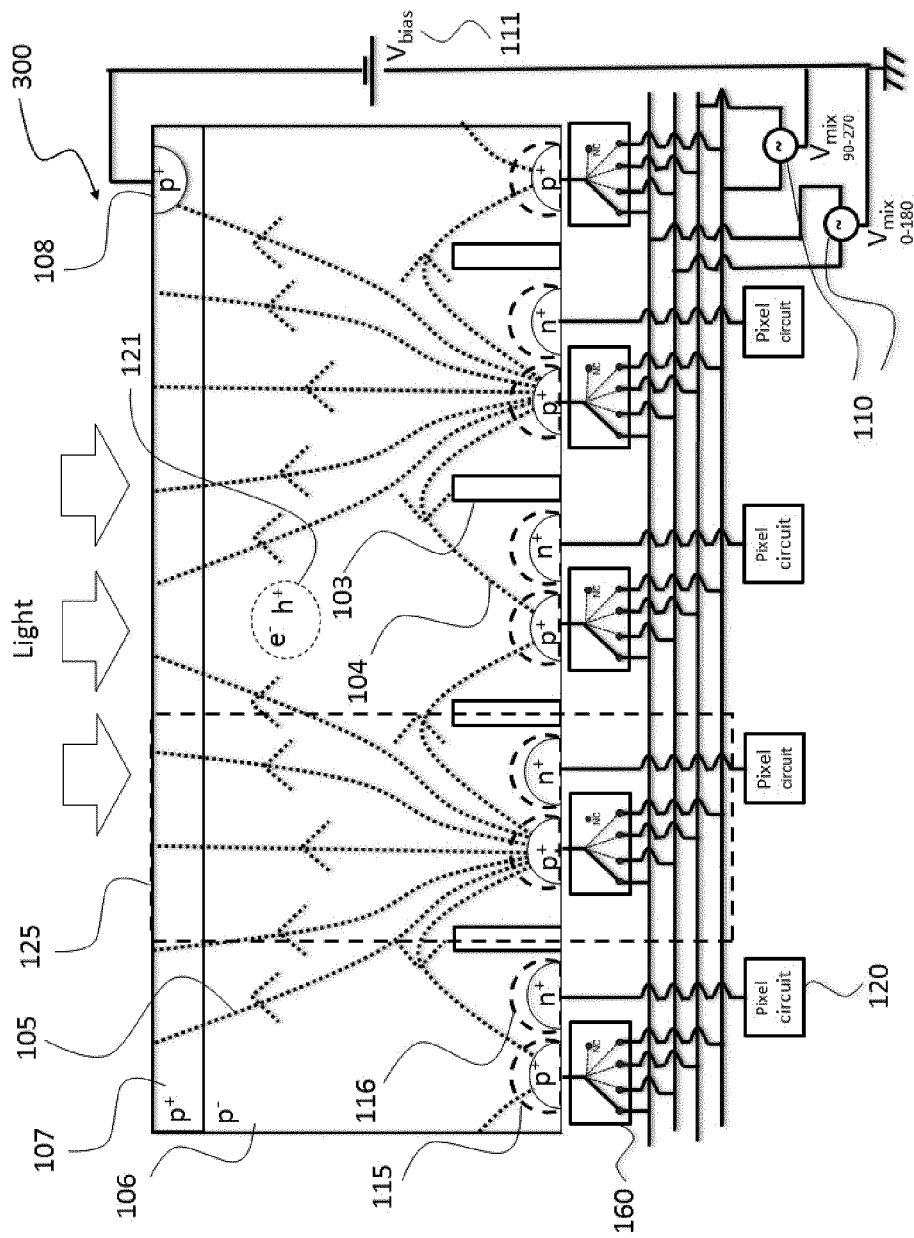
FIG. 10 shows another example of the detector device of the invention.

In FIG. 10, another example of the detector device 300 of the present invention is represented. FIG. 10 explains the practical implementation of TOF measurements and data binning. In this embodiment, in each pixel a selection switch 160 is implemented for selecting a predetermined voltage $V_{mix}$ to be applied to the control regions 115, thanks to the first source 110. Thanks to the selector 160, in TOF operation of the device, several different modulation signals can be operating the regions through the $V_{mix}$ voltage sources 110, to achieve the needed TOF correlation signals (e.g. 0°, 90°, 180°, 270°). Within each pixel, the selector 160 is implemented to select the modulation signal driven to the guiding control region, or select the NC node, allowing for the binning operation as presented in FIGS. 8 and 9. If a memory element is present in each pixel for enabling a selection per pixel of the signal, arbitrary binning patterns can be implemented.

When illumination of specific zones can be turned on/off at run-time, one could build a system where the illumination of specific zones is turned on/off in orchestration with the sensor zones being turned on/off. An illumination type that could achieve this is a VCSEL array.

Furthermore, some zones where the light is only detected and not demodulated could be envisaged, by selecting a DC voltage (not shown). This allows to create a non-TOF operating mode, attracting the light in a continuous mode.

The control circuitry or selection switches may also be arranged on a column- and/or row-level, be it per unit or groups of units or on a global level.

Figure 12:
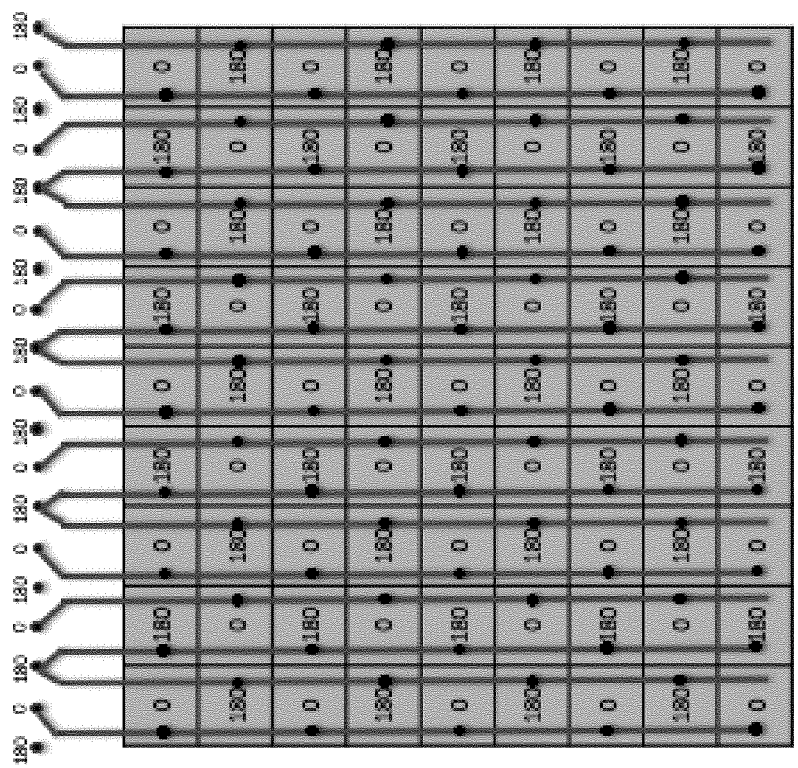
FIG. 12 shows another example of the detector device whereby column-level selectors enable different patterns and/or binning modes.
Figure 12:
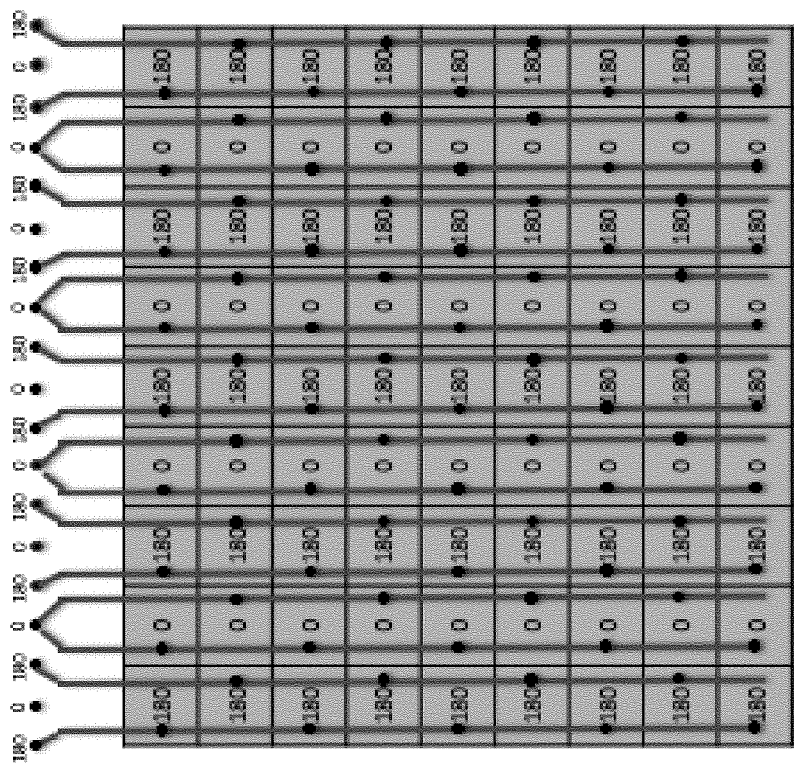

FIG. 12 shows an embodiment of the invention whereby through control of column-level selectors, the arrangement of the detector device can be modified. In this example shown in FIG. 12 it is possible by modifying the state of the selectors to go from a checkerboard arrangement of 0/180 TOF detectors to a column-wise arrangement of 0/180 TOF detectors.

Figure 13:
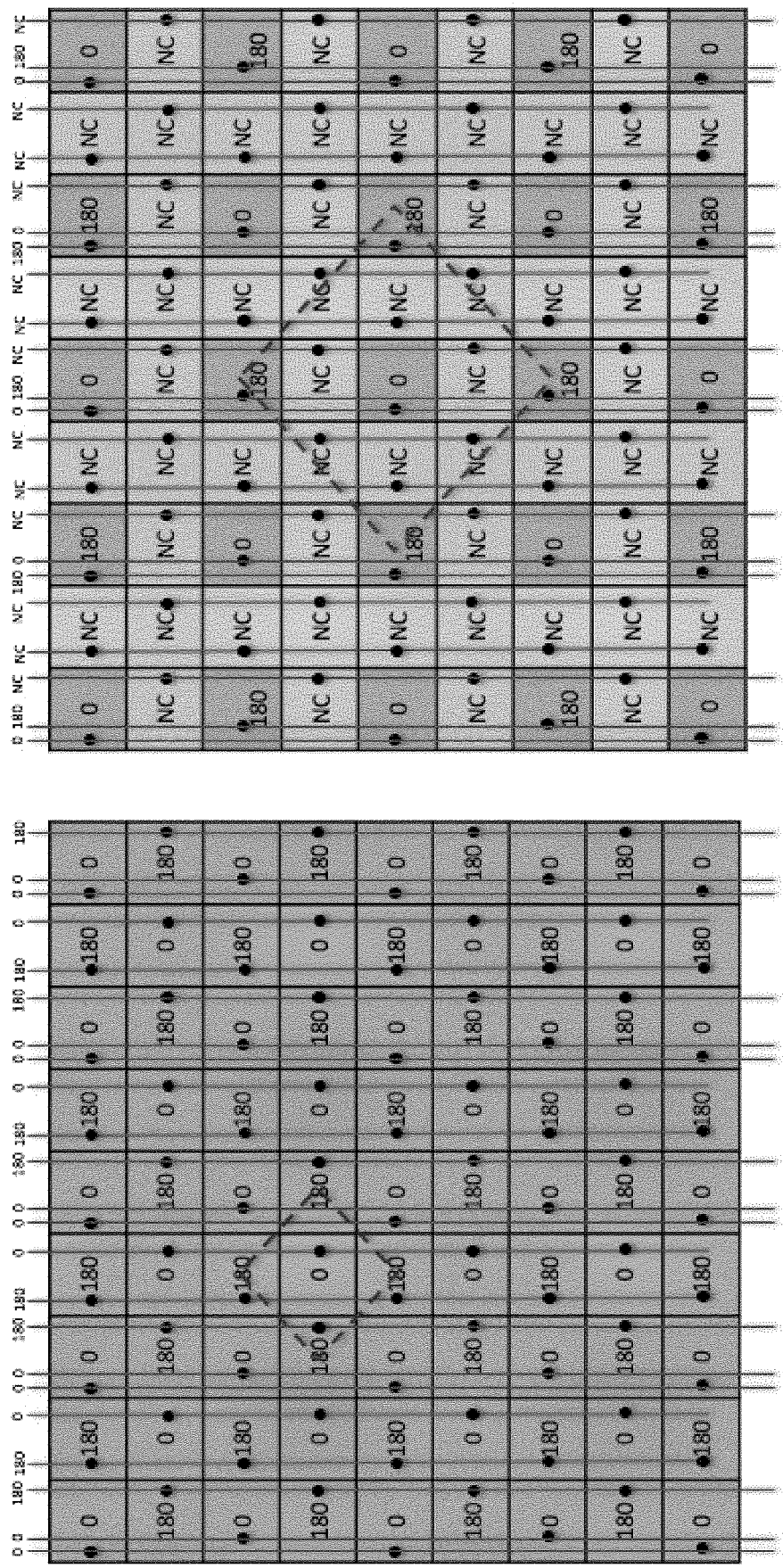
FIG. 13 shows another example of the detector device whereby column-level selectors enable different patterns and/or binning modes.

FIG. 13 shows another embodiment of the invention whereby through control of column-level selectors, the arrangement of the detector device can be modified. In this example shown in FIG. 13 it is possible by modifying the state of the selectors to go from a checkerboard arrangement with a virtual pixel pitch of X to a lower resolution checkerboard arrangement with virtual pixel pitch of X*2 with binned optical areas, through the setting of the selectors.

In FIG. 11, another example of the detector device of the present invention is shown. An RGBZ implementation is shown, wherein some optical filters are applied on top of the front side or backside of the semiconductor layer, depending on the FSI or BSI configuration, to only pass for example Red+ IR light (represented by R in the FIG. 11), Green+ IR light (represented by G in the FIG. 11), Blue+ IR light (represented by B in the FIG. 11), IR light (represented by D in the FIG. 11). Next to the normal TOF operation acquiring the Z data as described previously and that can be done at a different moment or in different pixels, the invention can also be optimized for regular imaging. For doing so, the first source 110 is adapted connecting all control zones to the same potential, disabling the TOF operation and allowing RGB and IR intensity data to be better isolated per pixel. This will result in only vertical fields, induced by built-in fields and voltage source 111. This will help to induce only vertical motion to the electrons and preserve the lateral position where the electron hole pair was photogenerated. Thus avoiding to mix the electrons generated underneath the different filters that could be applied on top of each individual cell (Red, Green, Blue, IR, Red+IR, Green+IR, Blue+IR, . . . ).

The invention claimed is:

1. A detector device, comprising:
   a semiconductor layer on which electromagnetic radiation can impinge and generate therein pairs of majority and minority carriers, the semiconductor layer being doped with a dopant of a first conductivity type; and
   at least two pixels, each comprising:
      at least one control region formed in the semiconductor layer, the at least one control region being doped with a dopant of the first conductivity type;
      at least one detection region formed in the semiconductor layer, the at least one detection region being doped with a dopant of a second conductivity type different than the first conductivity type, the at least one detection region being disposed adjacent the at least one control region to form a junction and collect generated minority carriers; and
      a first source configured to generate a plurality of majority carrier currents in the semiconductor layer between control regions of the at least two pixels, a first majority carrier current of the plurality of majority carrier currents being associated with a first electrical field;
   wherein minority carriers of the pairs of majority and minority carriers are distributed between the at least one detection regions of the at least two pixels by the first electrical field associated with the first majority carrier current,
   wherein one or more portions of an associated volume of a pixel of the at least two pixels and one or more portions of an associated volume of a neighbouring pixel of the at least two pixels form at least one overlapping virtual pixel zone, and
   wherein a volume of the at least one overlapping virtual pixel zone is controllable over time by providing a first control signal having a first phase to the pixel and a second control signal having a second phase to the neighbouring pixel, wherein the first phase and the second phase are different.

2. The detector device according to claim 1, wherein the detector device further comprises control circuitry configured to, using the first source, individually control at least one majority carrier current of the plurality of majority carrier currents.

3. The detector device according to claim 2, wherein the control circuitry is configured to control a first control region using the first control signal such that the volume of the at least one overlapping virtual pixel zone changes over time.

4. The detector device according to claim 2, wherein the control circuitry is configured to control a first control region of the control regions using the first control signal and to control a second control region neighbouring the first control region using the second control signal different than the first control signal.

5. The detector device according to claim 2, wherein the control circuitry is configured to control, using a same control signal, control regions of pixels of the at least two pixels that are arranged in a row or a column.

6. The detector device according to claim 2, wherein the control circuitry is configured to control, using the first control signal, a first control region, and to control, using the second control signal, wherein the second phase opposes the first phase of the first control signal, a second control region neighbouring the first control region.

7. The detector device according to claim 6, further comprising a plurality of adjacent taps, each tap of the plurality of adjacent taps being coupled to at least one detection region and at least one control region; and
   wherein the control circuitry is further configured to put one tap in a non-sensing or reduced sensitivity state by reducing, eliminating, or reversing the first majority carrier current to allow re-direction of the generated minority carriers to a closest sensing detection region.

8. The detector device of claim 2, wherein the control circuitry is configured to generate a pixel reset signal for each pixel of the at least two pixels or for multiple pixels of the at least two pixels.

9. The detector device according to claim 1, further comprising multiple selectors for selecting a predetermined voltage Vmix to be applied to one or more control regions by the first source.

10. The detector device according to claim 9, whereby a selector of the multiple selectors is shared between multiple pixels of the at least two pixels.

11. The detector device according to claim 9, whereby a selector of the multiple selectors is shared by a column of pixels or a row of pixels of the at least two pixels.

12. The detector device according to claim 9, whereby each pixel of the at least two pixels has a selector.

13. A sensor device comprising detector devices, the sensor device comprising:
    a semiconductor layer on which electromagnetic radiation can impinge and generate therein pairs of majority and minority carriers, the semiconductor layer being doped with a dopant of a first conductivity type; and
    at least two pixels, each comprising:
       at least one control region formed in the semiconductor layer, the at least one control region being doped with a dopant of the first conductivity type;
       at least one detection region formed in the semiconductor layer, the at least one detection region being doped with a dopant of a second conductivity type different than the first conductivity type, the at least one detection region being disposed adjacent the at least one control region to form a junction and collect generated minority carriers; and
       a first source configured to generate a plurality of majority carrier currents in the semiconductor layer between control regions of the at least two pixels, a first majority carrier current of the plurality of majority carrier currents being associated with a first electrical field;
    wherein minority carriers of the pairs of majority and minority carriers are distributed between the at least one detection regions of pixels of the at least two pixels by the first electrical field associated with the first majority carrier current,
    wherein one or more portions of an associated volume of a pixel of the at least two pixels and one or more portions of an associated volume of a neighbouring pixel of the at least two pixels form at least one overlapping virtual pixel zone, and wherein a volume of the at least one overlapping virtual pixel zone is controllable over time by providing a first control signal having a first phase to the pixel and a second control signal having a second phase to the neighbouring pixel, wherein the first phase and the second phase are different.

14. The detector device according to claim 1, further comprising processing circuitry configured to:

sample a charge associated with the minority carriers collected by at least one detection region; and process the charge associated with the collected minority carriers to generate Time-Of-Flight data.

15. The detector device according to claim 1, further comprising optical filters on top of a front side or a backside of the semiconductor layer.

16. The detector device according to claim 1, wherein the first source configured to supply a DC voltage.

17. An image sensor comprising a plurality of detector devices, the image sensor comprising:

a semiconductor layer on which electromagnetic radiation can impinge and generate therein pairs of majority and minority carriers, the semiconductor layer being doped with a dopant of a first conductivity type; and at least two pixels, each comprising:

at least one control region formed in the semiconductor layer, the at least one control region being doped with a dopant of the first conductivity type;

at least one detection region formed in the semiconductor layer, the at least one detection region being doped with a dopant of a second conductivity type different than the first conductivity type, the at least one detection region being disposed adjacent the at least one control region to form a junction and collect generated minority carriers; and a first source configured to generate a plurality of majority carrier currents in the semiconductor layer between control regions of the at least two pixels, a first majority carrier current of the plurality of majority carrier currents being associated with a first electrical field; wherein, minority carriers of the pairs of majority and minority carriers are distributed between the at least one detection regions of pixels of the at least two pixels by the first electrical field associated with the first majority carrier current, and one or more portions of an associated volume of a pixel of the least two pixels and one or more portions of an associated volume of a neighbouring pixel of the at least two pixels form at least one overlapping virtual pixel zone, and circuitry configured to:

control a volume of the at least one overlapping virtual pixel zone over time by controlling the pixel of the at least two pixels using a first signal having a first phase and controlling the neighbouring pixel of the at least two pixels using a second signal having a second phase different than the first phase, and based on the collected generated minority carriers collected by pixels of the at least two pixels, perform demosaicing of data associated with the at least one overlapping virtual pixel zone[[s]] to calculate individual pixel data.

18. The image sensor of claim 17, wherein the image sensor further comprises control circuitry configured to, using the first source, individually control at least one majority carrier current of the plurality of majority carrier currents.

19. The image sensor of claim 18, wherein the control circuitry is configured to control a first control region of the control regions with a first control signal having a first phase delay and to control a second control region neighbouring the first control region with a second control signal having a second phase delay different than the first phase delay.

20. The image sensor of claim 19, wherein the circuitry is configured to demosaic data associated with the at least one overlapping virtual pixel zone based on the first phase delay and the second phase delay.

* * * * *